Nov. 12, 1968 P. G. KUEFFER 3,410,081
DRIVE SYSTEM FOR TUNING FORK TIMEPIECE
Filed Oct. 4, 1965 3 Sheets-Sheet 1

INVENTOR
PHILIPPE G. KUEFFER by: Louis Altman
ATTY.

DRIVE SYSTEM FOR TUNING FORK TIMEPIECE

Filed Oct. 4, 1965

INVENTOR
PHILIPPE G. KUEFFER
by: Louis Altman
ATTY.

INVENTOR
PHILIPPE G. KUEFFER
by: Louis Altman
ATTY.

3,410,081

DRIVE SYSTEM FOR TUNING FORK TIMEPIECE

Philippe G. Kueffer, La Salle, Ill., assignor to General Time Corporation, New York, N.Y., a corporation of Delaware Filed Oct. 4, 1965, Ser. No. 492,793
8 Claims. (Cl. 58—23)

ABSTRACT OF THE DISCLOSURE

A timepiece movement including a tuning fork, an electronic circuit for applying driving impulses to the tuning fork in synchronism with the vibratory motion thereof, and a transducer for converting the vibratory motion of the tuning fork into rotary motion independently of the amplitude of the tuning fork vibration. The electronic control circuit includes a drive coil magnetically coupled to the tuning fork, a direct voltage source connected to the drive coil for energizing the same, a transistor for controlling the energization of the drive coil, a control coil magnetically coupled to the tuning fork and connected to the transistor for turning the transistor on and off, and a capacitor connected to the control coil and the transistor for applying an oscillatory energizing signal to the drive coil to start the vibratory motion of the tuning fork. The transistor circuit is designed to operate the transistor in the saturated mode so that the driving impulses are applied to the tuning fork independently of variations in the amplitude of the tuning fork motion. The transducer for converting the oscillatory motion of the tuning fork into rotary motion magnetically couples the tines of the tuning fork to the rotary indicating mechanism of the timepiece so as to be independent of the amplitude of the tuning fork vibrations.

This invention relates generally to electronic timing devices and, more particularly, to an improved transistorized drive system for an electronic timing device in which a tuning fork is used as the timekeeping standard.

It is a primary object of the present invention to provide an improved electronic driving system for a tuning fork timepiece in which the vibratory movement of the tuning fork is automatically started and then sustained at approximately the natural frequency of the tuning fork. It is a related object of the invention to provide an improved driving system of the foregoing type which operates independently of the amplitude of the tuning fork vibrations. Another related object is to provide such an improved drive system in which the driving speed remains substantially constant in the face of mechanical shocks and the like which vary the amplitude of the tuning fork vibrations.

It is another object of the invention to provide such an improved electronic driving system which permits the use of low cost transistors. In this connection, it is also an object to provide such a drive system in which the selection of an appropriate transistor is not nearly so critical as in transistorized drive systems proposed heretofore.

It is a further object of the present invention to provide an improved driving system of the type described in which the energy input to the tuning fork is applied equally to the two fork tines by means of a single drive coil.

Still another object is to provide such an improved drive system of extremely compact construction which can be economically manufactured and maintained. A related object is to provide such a drive system which can be built with a rugged construction capable of withstanding mechanical shocks.

Other objects and advantages will become apparent upon reading the following detailed description and upon reference to the drawings, in which.

Figure 1:
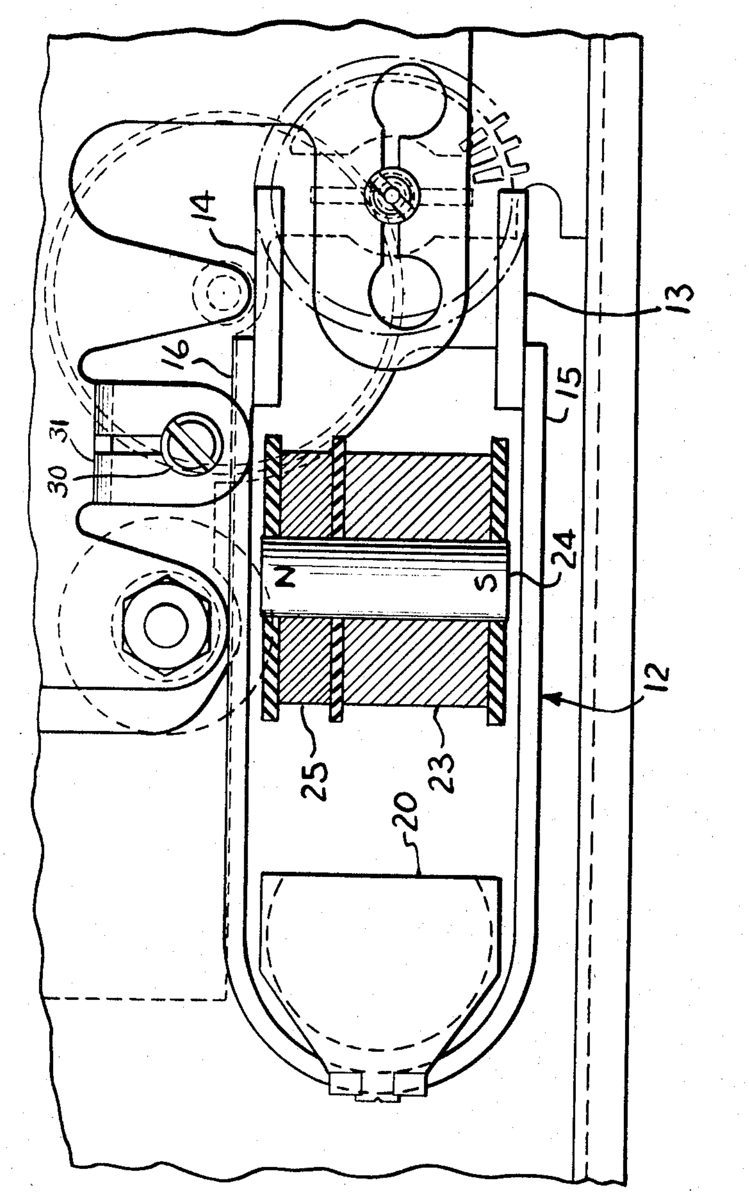
FIGURE 1 is a plan view of a timepiece drive system embodying the present invention.

Turning now to the drawings, there is shown a driving system for a conventional timepiece having a rotary indicating mechanism driven by a conventional gear train indicated generally at 10. The gear train 10, in turn, is driven by a rotor 11 which forms part of a magneto-mechanical transducer for deriving energy from a timekeeping standard in the form of a tuning fork 12 made of a magnetic flux-conducting material. The balance of the magneto-mechanical transducer is formed by a pair of generally C-shaped magnets 13 and 14 which are mounted on the ends of the tuning fork tines 15 and 16, respectively.

In order to couple the tuning fork 12 to the gear train 10, the rotor 11 is designed to form two concentric sets of radially extending circumferentially spaced magnetic elements with the elements in one of the two sets being circumferentially offset from the elements in the other set. Thus, the rotor 11 includes a plurality of circumferentially spaced radial teeth 17 which are made of a magnetic flux-conducting material to form the first set of magnetic elements. Spaced inwardly from the magnetic teeth 17 is a circular array of radial apertures 18 which are aligned with the magnetic teeth 17 so as to form a plurality of radial ribs 19 which form the second set of magnetic elements. It can be seen that the magnetic ribs 19 are arranged concentrically with respect to the magnetic teeth 17 and are circumferentially offset from the magnetic teeth 17.

To cooperate with the two sets of magnetic elements formed by the rotor 11, the two C-shaped magnets 13, 14 define aligned air gaps 13*a*, 14*a* which are open in the direction of the vibratory movement of the tuning fork tines. The base of the tuning fork is secured to a mounting stud 20 which is positioned so that the magnetic elements formed by the rotor 11 pass through the open slot formed by the air gaps 13*a*, 14*a*, between the opposed magnetic poles of the magnets 13, 14, as the rotor is rotated. The C-shaped or arcuate magnets 13, 14 are mounted perpendicular to the plane of vibration so that the opposed faces of the magnetic poles extend in the direction of vibration of the fork tines so as to enable vibratory movement of the tines relative to the rotor while maintaining a substantially constant air gap between the vibrating magnetic poles and the rotor 11. Thus, the magnetic poles of each of the two magnets 13, 14 are located at the ends of the C so that the poles are located on opposite sides of the rotor 11 whereby the radial magnetic elements formed by the rotor continually pass through the magnetic field created by the opposed poles. As the tuning fork is vibrated, the opposed poles of the two C-shaped magnets 13, 14 sweep back and forth on opposite sides of the magnetic elements 17, 19 so as to drive the rotor 11 continuously at a speed directly proportional to the frequency of vibration of the tuning fork.

One important feature of the magneto-mechanical transducer used in the illustrative timepiece is that the angular velocity of the rotor 11 is dependent only on the frequency of vibration of the tuning fork 12, i.e., the rotor velocity is independent of variations in the amplitude of the tuning fork vibrations. Since a tuning fork inherently tends to vibrate at a substantially constant frequency, i.e., its natural frequency, it will be appreciated that the angular velocity of the rotor 11 also remains substantially constant and is not affected by variations in the amplitude of the tuning fork due to external shocks or other disturbances which are often encountered in actual use of such timepieces. The particular design of the magneto-mechanical transducer per se is not a part of the present invention and is described in more detail in Canadian Patent No. 675,942, entitled "Magnetic Escapement," issued Dec. 10, 1963 to K. Ishikawa and K. Iwaki.

In order to load the two tines of the tuning fork equally and thereby avoid any cantilever type oscillation of the tuning fork, the two C-shaped magnets 13, 14 are positioned symmetrically with respect to the axis of the rotor. Thus, the magnetic forces between each of the magnets 13, 14 and the rotor are substantially equal in magnitude so that the two tines of the fork are properly balanced. Also, for the same purpose, the two magnets 13, 14 should be of similar design so that essentially the same mass is added to each of the two tines when the magnets are mounted thereon. While the illustrative embodiment of the magneto-mechanical transducer includes a pair of magnets 13, 14 cooperating with the rotor, it will be understood that any one magnet (mounted on one of the tines) may be used with a balancing mass mounted on the other fork tine.

In accordance with the present invention, there is provided an improved transducer for initiating and sustaining the vibratory motion of the tuning fork, the transducer comprising an LC resonant feedback oscillator including a direct voltage source, a transistor in circuit with the voltage source, and a pair of coils in circuit with the transistor and inductively coupled to each other for providing regenerative feedback, the two coils being magnetically coupled to the tuning fork for initiating and sustaining vibratory motion thereof, the oscillator circuit being designed to operate the transistor in a saturated mode so that the circuit output is independent of variations in the amplitude of the tuning fork vibrations.

Figures 2, 3, 4:
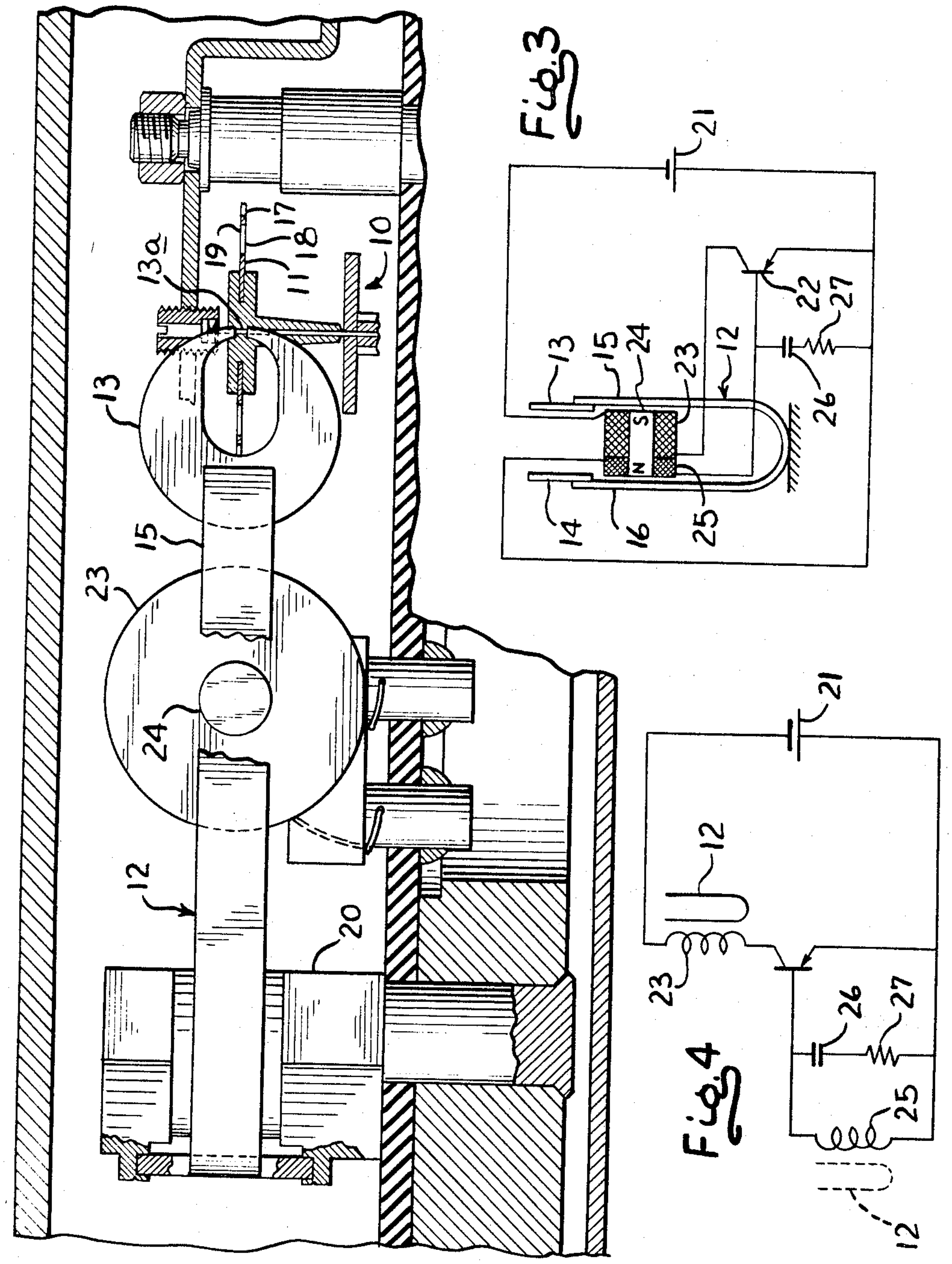
FIG. 2 is a side elevation of the drive system of FIG. 1 with a fragment of the tuning fork being broken away to show the internal structure.
FIG. 3 is a schematic diagram of the circuit in the drive system of FIG. 1 with the two coils of the circuit being shown in their actual physical positions relative to the tuning fork.
FIG. 4 is another schematic diagram of the circuit in the drive system of FIG. 1 with the two coils shown in schematic form.

Referring particularly to FIGURES 3 and 4 of the drawings, the illustrative LC resonant feedback oscillator derives power from a direct voltage source in the form of a battery 21 for initiating and sustaining vibratory motion of the tuning fork 12. The oscillator circuit includes a transistor 22 having its emitter and collector connected in circuit with the battery 21 and with a drive coil 23 which is magnetically coupled to the tuning fork tines via a magnetized core 24. The feedback portion of the circuit comprises a second coil 25 which is inductively coupled to the first coil 23 by being wound on the same core member 24. The second coil 25 is connected in circuit with the base and emitter of the transistor 22, and a series arrangement of a frequency-determining capacitor 26 and a damping resistor 27 is connected across the coil 25.

Figure 5:
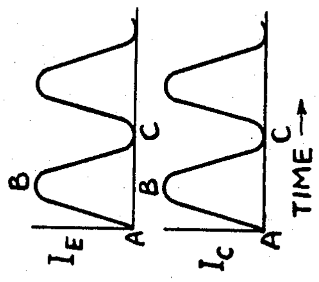
FIG. 5 is a graph showing the wave forms of the emitter and collector currents in the circuit of FIGS. 3 and 4 before the tuning fork has been started vibrating.

Prior to initiation of the tuning fork vibrations, the oscillator circuit operates in the conventional manner with the oscillator output being applied to the drive coil 23 for the purpose of initiating vibratory motion of the fork tines. Thus, when input power is supplied to the oscillator from the voltage source 21, current flow in the emitter-collector circuit increases from point A in FIGURE 5 as a result of the regenerative feedback through the inductively coupled coils 23 and 25. Eventually a point B is reached at which the emitter current can no longer increase (the transistor is saturated), the feedback current reverses, and the emitter and collector currents then decrease from point B to point C where the transistor is cut-off. The bias conditions then revert to their original state, and the process is repeated, thereby generating a continuous oscillating output. The time for change from saturation to cut-off is determined primarily by the capacitor 26 which, in turn, determines the frequency of oscillation.

In accordance with one aspect of this invention, the common core of the two inductively coupled coils of the oscillator circuit is disposed between the tines of the tuning fork with the opposite ends of the core equally spaced from the respective tines. Consequently, the oscillator output applied to the drive coil 23 produces alternating magnetic forces between the ends of the core 24 and both tines of the tuning fork to quickly start vibration of the tines. Since the opposite ends of the core 24 are equally spaced from the two tines 15, 16 of the tuning fork, the driving magnetic signal is applied to the two tines with substantially equal force so that the fork remains perfectly balanced. The oscillator circuit itself starts oscillating as soon as power is supplied from the battery 21.

In order to sustain the vibratory motion of the tuning fork after it has been started by the oscillator output, the feedback coil 25, referred to hereinafter as the "pickup" coil, is also magnetically coupled to the tuning fork via the magnetic core 24. As the tuning fork starts to vibrate, the movement of the fork tines relative to the coil 25 induces an alternating voltage, referred to hereinafter as the "control" signal, in the pickup coil. This alternating control signal is applied to the base of transistor 22 with each positive half cycle turning the transistor off and each negative half cycle turning the transistor on. The magnitude of this control signal increases with increasing amplitude of the tuning fork, thereby regeneratively increasing the energy input to the tuning fork until the drive coil delivers the exact amount of energy required to sustain the vibration of the tuning fork, i.e., the amount of energy required to replace energy losses due to hysteresis losses in the material of the tuning fork and the mechanical loads on the tuning fork.

As can be seen from the foregoing description, the vibratory motion of the tuning fork 12 effectively changes the function of the drive circuit from a resonant oscillator, producing an oscillatory output at a frequency determined by the capacitor 26, to a switching mode amplifier, producing a pulse output at a rate determined by the vibratory frequency of the tuning fork. The circuit continues to function as a switching mode amplifier as long as the tuning fork vibrates, with the pickup coil being connected to the amplifier input circuit, and the drive coil 23 being connected in the amplifier output circuit.

Figure 6:
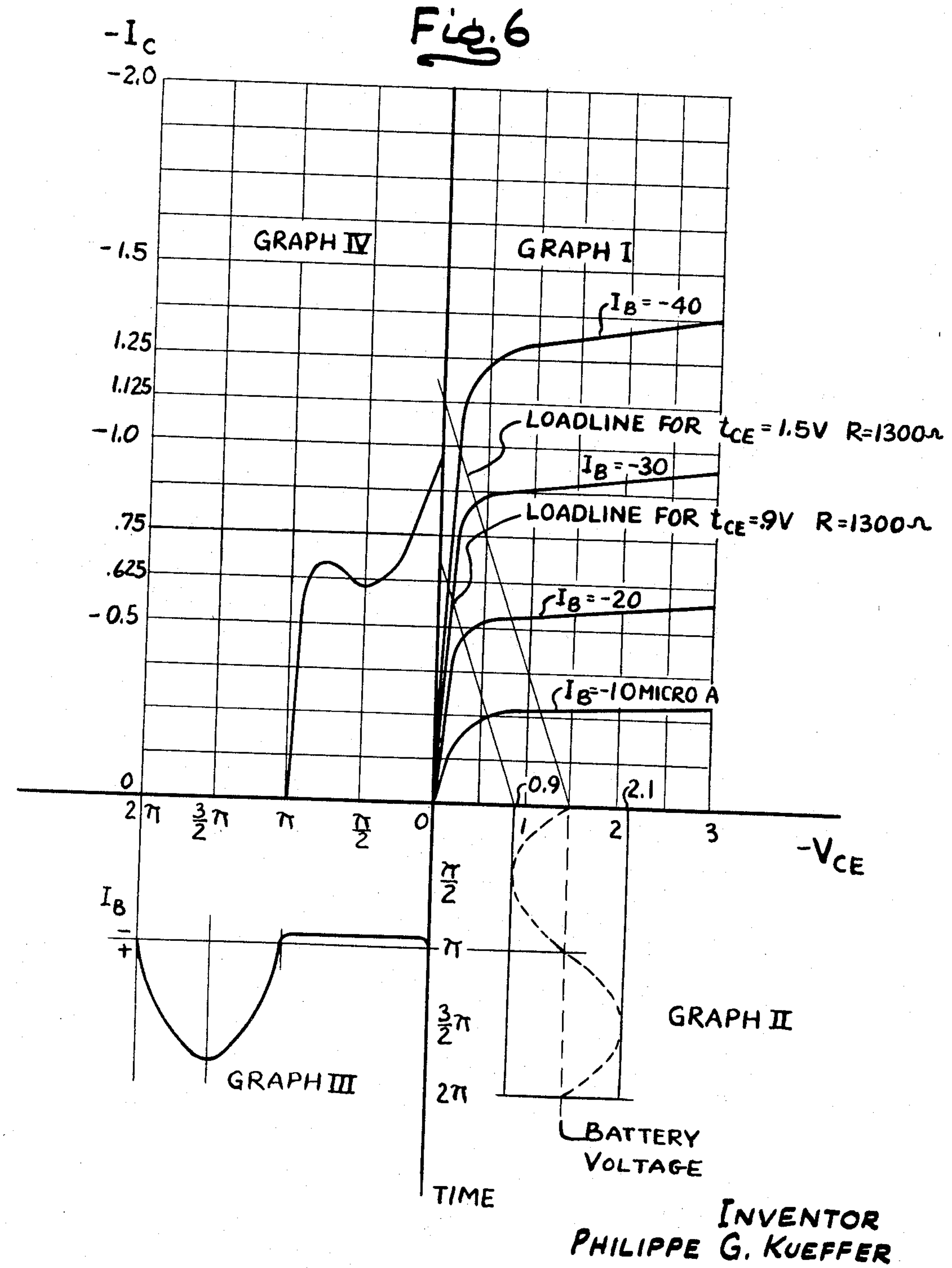
FIG. 6 is a group of graphs showing various wave forms in the circuit of FIGS. 3 and 4 while the tuning fork is vibrating.

The operation of the drive circuit as a switching mode amplifier, i.e., the steady state operation of the circuit while the tuning fork is vibrating at substantially its natural frequency, is illustrated by the group of graphs in FIGURE 6. Graph I in the upper right hand corner shows the collector voltage verses collector current characteristics for different values of base current in a conventional PNP transistor. It can be seen from this family of curves that the collector current flows only when the base current is negative. Thus, it follows that current can flow through the drive coil 23 connected in the emitter-collector circuit only during negative half cycles of the control voltage induced in the pickup coil 25. Conversely, the transistor is turned off, and there is no current flow through the drive coil, during each positive half cycle of the control signal induced in the pickup coil 25.

In addition to inducing an alternating control signal in the pickup coil 25, the tuning fork vibrations induce a counter E.M.F. in the drive coil 23 so as to superimpose an alternating voltage on the direct voltage supplied by the battery 21. The resultant collector-emitter voltage during one cycle of tuning fork vibration is illustrated in graph II in the lower right hand corner of FIGURE 6. It is important to note that the battery voltage is designed to be sufficiently high that the collector-emitter voltage never approaches the unsaturated region of the collector characteristics, even when a relatively large counter E.M.F. is induced in the drive coil. In other words, the circuit is designed to operate the transistor in the saturated mode where the collector current is substantially independent of variations in the collector voltage, and is never permitted to operate in the unsaturated region where the collector current varies rather sharply with variations in the collector voltage. Since the transistor is always overdriven for operation in the saturated mode, the collector current, and thus the driving forces applied to the tuning fork, are independent of variations in the amplitude of the tuning fork vibrations. Moreover, this feature permits the use of low cost transistors, and the choice of a particular transistor is not nearly so critical as in many timepiece drive systems proposed heretofore.

In keeping with the present invention, the transistor of the drive circuit is turned on, or rendered conductive, during approximately half of each cycle of the alternating control voltage induced in the pickup coil 25. As shown in graphs III and IV on the left hand side of FIGURE 6, each positive half cycle of the induced control signal renders the transistor nonconductive so that there is no current flow in the amplifier output circuit. During each negative half cycle of the control signal, a relatively constant negative base current is obtained due to the capacitor 26. Thus, at the start of each negative half cycle, a portion of the current from the pickup coil flows into the base of the transistor, with the balance of the current charging the capacitor 26 throughout the first half of this negative half cycle. During the latter half of the negative half cycle, the capacitor discharges so as to maintain the base current at a relatively constant level. As a result, the transistor remains conductive during substantially the entire period of each negative half cycle of the induced control signal, with the transistor being operated in the saturated mode during this entire period.

The resulting collector current applied to the drive coil 23 during the conductive interval is shown in graph IV in the upper left hand corner of FIGURE 6, this graph having been plotted by the conventional load line technique. It will be appreciated that the collector current wave form roughly resembles one half cycle of a square wave, so that a driving impulse is applied to the tuning fork tines during essentially one half cycle of the vibratory motion thereof. The tuning fork is moving continuously in the same direction during this half cycle, and the drive circuit is designed so that the driving impulses reinforces the normal motion of the tuning fork during that particular half cycle. In other words, if the two tines of the tuning fork are normally moving away from the opposite ends of the magnetic core 24 during the half cycles when the driving impulses are applied, a circuit is designed to apply a repelling magnetic force to the tines so as to reinforce the outward movement of the tines during that half cycle.

For the purpose of adjusting the frequency of the tuning fork 12, a permanently magnetized screw 30 is threaded into a brass mounting bracket 31 alongside one of the tuning fork tines. By advancing or retracting this magnetized screw 30 within the mounting bracket 31, a supplemental load may be applied to the vibrating fork. In other words, the magnetized screw provides a damping effect on the vibrating fork, and the degree of damping applied may be varied by mechanical adjustment of the screw.

It can be seen from the foregoing detailed description that this invention provides an improved electronic driving system for a tuning fork timepiece which operates independently of the amplitude of the tuning fork vibrations. The vibratory movement of the tuning fork is automatically started by operating the drive circuit as an oscillator, but once the tuning fork is vibrating, the oscillator circuit functions as a switching mode amplifier producing a pulse output with the rate of the pulses corresponding to the vibratory frequency of the tuning fork. The improved drive system provided by this invention drives the timepiece at a substantially constant speed even in the face of mechanical shocks or other disturbances which vary the amplitude of the tuning fork vibrations. Moreover, the inventive driving system permits the use of low cost transistors, and the selection of an appropriate transistor is not nearly so critical as in transistorized drive systems proposed heretofore. Since the drive coil and the pickup coil are wound on a common core located symmetrically between the two tines of the tuning fork, the energy input to the tuning fork is applied equally to each of the two tines by means of a single drive coil. Furthermore, the improved drive system of this invention is extremely compact and rugged and can be economically manufactured and maintained.

I claim as my invention:

1. In a timepiece including a rotary indicating mechanism, the combination of a tuning fork having a natural frequency of vibration and means for magnetically coupling the vibrating tines of said tuning fork to the rotary indicating mechanism for driving said rotary mechanism at a speed proportioned to the frequency of vibration of the tuning fork and independently of the amplitude of the vibrations of the tuning fork, a drive coil magnetically coupled to said tuning fork for initiating and sustaining vibratory motion of the tuning fork, a direct voltage source operatively connected to said drive coil for energizing the drive coil, a transistor including a control electrode and being operatively connected to said drive coil and said voltage source for controlling the energization of said drive coil, a control coil and a capacitor operatively connected to said control electrode with the control coil being inductively coupled to said drive coil for regenerative feedback to said control electrode in response to energization of said drive coil for applying an oscillatory energizing signal to said drive coil to initiate vibratory motion of the tuning fork, said control coil being magnetically coupled to said tuning fork so that alternating control signals are induced in said control coil in response to the vibratory motion of said tuning fork for rendering said transistor alternately conductive and nonconductive whereby repetitive energizing pulses are applied to said drive coil in synchronism with the vibratory motion of the tuning fork so as to sustain said vibratory motion, said transistor and voltage source being adapted to operate said transistor in the saturated mode so that the energization of said driving coil is independent of variations in the amplitude of the vibratory motion of the tuning fork.

2. In a timepiece including a rotary indicating mechanism, the combination of a tuning fork having a natural frequency of vibration and made of magnetic flux-conducting material, means for magnetically coupling the vibrating tines of said tuning fork to the rotary indicating mechanism for driving said rotary mechanism at a speed proportional to the frequency of vibration of the tuning fork and independently of the amplitude of the vibrations of the tuning fork, a direct voltage source, and transducer means operatively associated with said tuning fork and said voltage source for vibrating the tines of the tuning fork, said transducer means comprising a transistor having emitter, base and collector electrodes, a first coil in series with said voltage source between said emitter and collector electrodes, said first coil being magnetically coupled to said tuning fork for applying driving impulses to the tuning fork, a second coil connected between said base and emitter electrodes and inductively coupled to said first coil for regenerative feedback, a resistance-capacitance network in circuit with said second coil for determining the frequency of the driving impulses, said second coil being magnetically coupled to said tuning fork for inducing control signals in the second coil in response to vibratory motion of the fork so that after the vibration of the tuning fork is initiated, the rate of the driving impulses is determined by the vibratory frequency of the tuning fork, said transducer being adapted to operate the transistor in the saturated mode so that the driving impulses are independent of variations in the amplitude of the tuning fork vibrations.

3. In a timepiece including a rotary indicating mechanism, the combination of a tuning fork having a natural frequency of vibration and made of a magnetic flux-conducting material, means for magnetically coupling the vibrating tines of said tuning fork to the rotary indicating mechanism for driving said rotary mechanism at a speed proportional to the frequency of vibration of the tuning fork and independently of the amplitude of the vibrations of the tuning fork, a direct voltage source, and transducer means operatively associated with said tuning fork and said voltage source for initiating and sustaining vibratory motion of the tuning fork, said transducer comprising an LC resonant feedback oscillator powered by said voltage source and including a transistor and a pair of coils inductively coupled to each other for providing regenerative feedback, said coils being wound on a common core disposed between the tines of the tuning fork with the ends of the core substantially equally spaced from the respective tines whereby the oscillator output generated in a first one of said coils produces alternating magnetic forces between the ends of said core and the fork tines for initiating vibratory motion of the fork, the vibratory motion of said fork inducing an alternating control signal in the second of said coils for switching the transistor on and off so as to generate driving impulses in the first coil in synchronism with the vibratory motion of the fork, said oscillator circuit being adapted to saturate the transistor whenever the transistor is turned on so that the driving forces applied to the tuning fork are independent of the amplitude of the tuning fork vibrations.

4. In a timepiece including a rotary indicating mechanism, the combination of a tuning fork having a natural frequency of vibration and made of a magnetic flux-conducting material, means for magnetically coupling the vibrating tines of said tuning fork to the rotary indicating mechanism for driving said rotary mechanism at a speed proportional to the frequency of vibration of the tuning fork and independently of the amplitude of the vibrations of the tuning fork, an electronic switching circuit including a transistor having input and output circuits, a direct voltage source for powering the switching circuit, a first coil in the output circuit and a second coil in the input circuit, said input circuit including a capacitor operatvely connected to the second coil and said second coil being inductively coupled to the first coil for providing regenerative feedback from the output circuit to the input circuit so that the switching circuit generates an oscillating output, said first coil being magnetically coupled to said tuning fork for initiating vibratory motion of the tuning fork in response to said oscillating output, said second coil also being magnetically coupled to said tuning fork for inducing an alternating control signal in said input circuit in response to the vibratory motion of the tuning fork for changing the oscillating output to a series of output pulses synchronized with the fork vibrations for sustaining the vibratory motion of the tuning fork, said switching circuit being designed to operate the transistor in a saturated mode so that the output pulses are substantially independent of the amplitude of the tuning fork vibrations.

5. In a timepiece including a rotary indicating mechanism, the combination of a tuning fork having a natural frequency of vibration and made of a magnetic flux-conducting material, means for magnetically coupling the vibrating tines of said tuning fork to the rotary indicating mechanism for driving said rotary mechanism at a speed proportional to the frequency of vibration of the tuning fork and independently of the amplitude of the vibrations of the tuning fork, a direct voltage source, and transducer means operatively associated with said tuning fork and said voltage source for vibrating the tines of the tuning fork, said transducer means comprising an LC resonant feedback oscillator circuit including a transistor and a pair of coils in circuit with said transistor and inductively coupled to each other for regenerative feedback, one of said coils being magnetically coupled to said tuning fork for applying alternating magnetic forces to the tuning fork at a predetermined frequency to start vibration of the tuning fork, the other of said coils also being magnetically coupled to the tuning fork for inducing control signals in said other coil so that after the vibration of the tuning fork is initiated, driving impulses are applied to the tuning fork by the first coil in response to the control signals induced in the other coil, said oscillator circuit being adjusted to operate said transistor in a saturated mode so that the circuit output is independent of variations in the amplitude of the tuning fork vibrations.

6. In a timepiece including a rotary indicating mechanism, the combination of a tuning fork having a natural frequency of vibration and made of a magnetic flux-conducting material, means for magnetically coupling the vibrating tines of said tuning fork to the rotary indicating mechanism for driving said rotary mechanism at a speed proportional to the frequency of vibration of the tuning fork and independently of the amplitude of the vibrations of the tuning fork, and transducer means operatively associated with said tuning fork comprising an LC resonant feedback oscillator including a direct voltage source, a transistor in circuit with the voltage source, and a pair of coils in circuit with the transistor and inductively coupled to each other, the two coils being magnetically coupled to said tuning fork for initiating and sustaining vibratory motion thereof, the oscillator circuit being designed to operate the transistor in a saturated mode so that the circuit output is independent of variations in the amplitude of the tuning fork vibrations.

7. An improved timekeeping method comprising the steps of providing a rotary time indicating mechanism, a tuning fork having a natural frequency of vibration, and means for magnetically coupling the vibrating tines of said tuning fork to the rotary indicating mechanism for driving said rotary mechanism at a speed proportional to the frequency of vibration of the tuning fork and independently of the amplitude of the vibrations of the tuning fork, transducer means comprising a drive coil magnetically coupled to said tuning fork for initiating and sustaining vibratory motion of the tuning fork, a direct voltage source operatively connected to said drive coil for energizing the drive coil, a transistor including a control electrode and operatively connected to said drive coil and said voltage source for controlling the energization of said drive coil, and a control coil and a capacitor operatively connected to said control electrode with the control coil being inductively coupled to said drive coil for regenerative feedback to said control electrode in response to energization of said drive coil for applying an oscillatory energizing signal to said drive coil to initiate vibratory motion of the tuning fork, said control coil being magnetically coupled to said tuning fork so that alternating control signals are induced in said control coil in response to the vibratory motion of said tuning fork for rendering said transistor alternately conductive and nonconductive whereby repetitive energizing pulses are applied to said drive coil in synchronism with the vibratory motion of the tuning fork so as to sustain said vibratory motion, and operating said transistor in the saturated mode so that the energization of said driving coil is independent of variations in the amplitude of the vibratory motion of the tuning fork.

8. An improved timekeeping method as set forth in claim 7 wherein said transducer means is an LC resonant feedback oscillator.

(References on following page)

References Cited

UNITED STATES PATENTS

| | | | |
|---|---|---|---|
| 2,971,323 | 2/1961 | Hetzel | 58—23 |
| 3,100,278 | 8/1963 | Reich | 58—23 |
| 3,116,466 | 12/1963 | Grib | 58—23 |
| 3,162,006 | 12/1964 | Van Haaften | 58—23 |
| 3,225,536 | 12/1965 | Reich | 58—23 |
| 3,171,991 | 3/1965 | Baumer | 58—23 |

RICHARD B. WILKINSON, *Primary Examiner.*

EDITH C. SIMMONS, *Assistant Examiner.*